US009449864B2

(12) United States Patent
Lin et al.

(10) Patent No.: US 9,449,864 B2
(45) Date of Patent: Sep. 20, 2016

(54) SYSTEMS AND METHODS FOR FABRICATING AND ORIENTING SEMICONDUCTOR WAFERS

(71) Applicant: Taiwan Semiconductor Manufacturing Co., Ltd., Hsin-Chu (TW)

(72) Inventors: Chin-Ming Lin, Jhunan Township (TW); Wan-Lai Chen, Hsinchu (TW); Chia-Hung Huang, Hsinchu (TW); Chi-Ming Yang, Hsinchu (TW); Chin-Hsiang Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/494,621

(22) Filed: Sep. 24, 2014

(65) Prior Publication Data

US 2015/0009499 A1    Jan. 8, 2015

Related U.S. Application Data

(62) Division of application No. 13/449,721, filed on Apr. 18, 2012, now Pat. No. 8,871,605.

(51) Int. Cl.
*H01L 21/683* (2006.01)
*H01L 21/68* (2006.01)
*H01L 21/268* (2006.01)
(Continued)

(52) U.S. Cl.
CPC .......... *H01L 21/681* (2013.01); *H01L 21/268* (2013.01); *H01L 21/67282* (2013.01); *H01L 21/683* (2013.01); *H01L 23/544* (2013.01);
(Continued)

(58) Field of Classification Search
USPC .............................. 356/600–636; 438/14–16
See application file for complete search history.

(56) References Cited

U.S. PATENT DOCUMENTS

| 5,194,743 A | * | 3/1993 | Aoyama | ............... | H01L 21/681 250/548 |
| 5,876,819 A | | 3/1999 | Kimura et al. | | |

(Continued)

FOREIGN PATENT DOCUMENTS

| JP | 08-339946 | 12/1996 |
| JP | 2007-523371 | 8/2007 |

(Continued)

OTHER PUBLICATIONS

Official Action issued Aug. 31, 2013 in counterpart Korean Patent Application No. 10-2012-0075975.

(Continued)

*Primary Examiner* — Sang Nguyen
(74) *Attorney, Agent, or Firm* — Duane Morris LLP

(57) ABSTRACT

A system for orienting a semiconductor wafer. The system includes a wafer retaining device configured to retain a semiconductor wafer, a light source configured to emit light toward an edge exclusion area of the wafer, and a lens configured to direct and focus light emitted from the light source at a subsurface first part of a first portion of the wafer to alter a crystalline structure of the subsurface first part and form a subsurface mark that is detectable using light of a predetermined wavelength, a predetermined transmittance through the wafer, and at a predetermined reflectance angle relative to an axis of rotation of the wafer and based on the predetermined wavelength.

19 Claims, 8 Drawing Sheets

(51) Int. Cl.
*H01L 23/544* (2006.01)
*H01L 21/67* (2006.01)
(52) U.S. Cl.
CPC .............. *H01L 2223/54426* (2013.01); *H01L 2223/54493* (2013.01); *H01L 2924/0002* (2013.01)

(56) References Cited

U.S. PATENT DOCUMENTS

| | | | |
|---|---|---|---|
| 6,768,542 B2* | 7/2004 | Ise | G01N 21/9501 356/237.1 |
| 7,057,259 B2 | 6/2006 | Arikado et al. | |
| 7,672,502 B2 | 3/2010 | Osada et al. | |
| 7,704,652 B2 | 4/2010 | Hatai | |
| 7,751,067 B1* | 7/2010 | True | G01B 11/00 356/399 |
| 7,842,442 B2 | 11/2010 | Seltmann et al. | |
| 7,861,421 B2* | 1/2011 | Kobayashi | H01L 21/76251 33/1 N |
| 8,175,831 B2 | 5/2012 | Izikson et al. | |
| 8,389,099 B1* | 3/2013 | Matthews | H01L 23/544 148/33.2 |
| 2002/0153620 A1* | 10/2002 | Guldi | H01L 21/67282 257/797 |
| 2003/0003608 A1 | 1/2003 | Arikado et al. | |
| 2006/0269851 A1 | 11/2006 | Frisa et al. | |

FOREIGN PATENT DOCUMENTS

| | | |
|---|---|---|
| KR | 2002-0075282 | 10/2002 |
| WO | 2005079470 A2 | 9/2005 |

OTHER PUBLICATIONS

Virginia Semiconductor, Inc., "Optical Properties of Silicon", 11 pages. Retrieved from: <http://www.virginiasemi.com/pdf/Optical%20Properties%20of%20Silicon71502.pdf>. No date.

Official Action issued Apr. 2014 in counterpart Korean Patent Application No. 10-2012-0075975.

* cited by examiner

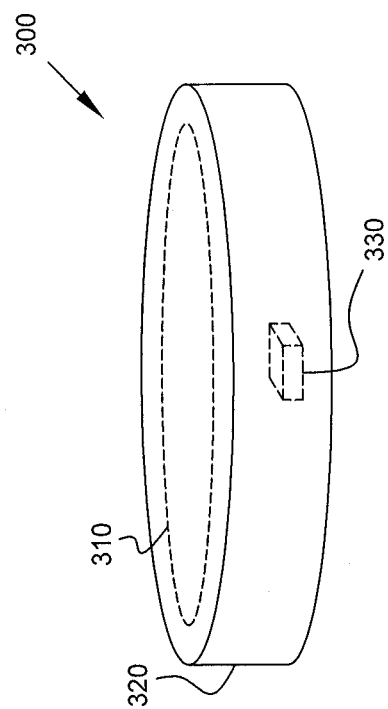
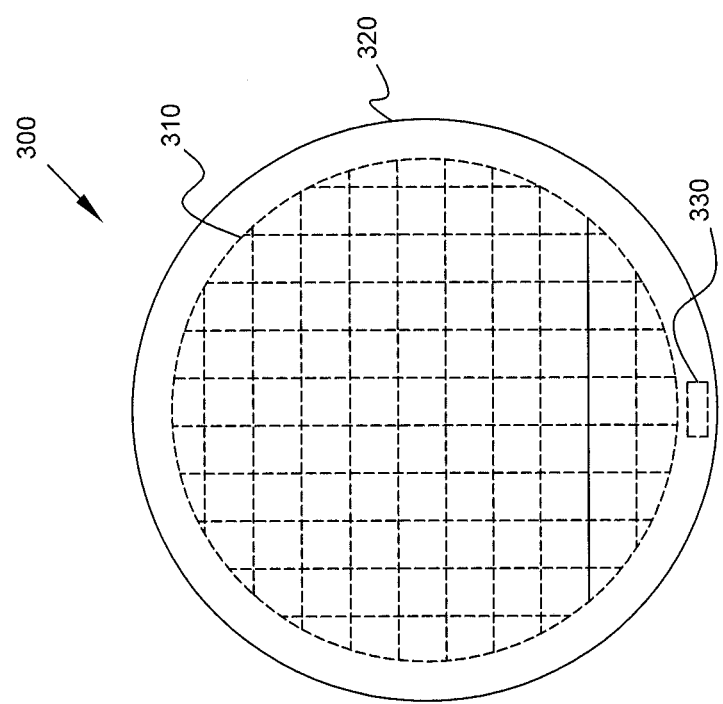
Figure 3B
Figure 3A

SYSTEMS AND METHODS FOR FABRICATING AND ORIENTING SEMICONDUCTOR WAFERS

CROSS-REFERENCE TO RELATED APPLICATIONS

This application is a divisional application of and claims priority to U.S. patent application Ser. No. 13/449,721, filed on Apr. 18, 2012, the entirety of which is herein incorporated by reference.

FIELD

The present disclosure relates generally to semiconductor fabrication, and more specifically to systems and methods for fabricating semiconductor wafers.

BACKGROUND

Semiconductor wafers are conventionally formed with a notch to orient the wafers and provide a reference for wafer handling machinery. Processes for forming the notch typically involve grinding a surface of the wafer or the ingot. These processes adversely affect semiconductor process performance. For example, uniformity of the thickness of a photoresist coating, or chemical mechanical polishing (CMP) film thickness, across the surface of the wafer can be degraded by the presence of the notch. Plasma density and chemical distribution for etching processes can also be adversely impacted by the notch. Additional costs are associated with compensating for these degradations in process performance. The notch is also a particle source resulting in wafer contamination (especially during high vacuum processes), equipment damage, and additional preventative maintenance requirements to avoid equipment damage.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

FIG. 3A is a schematic diagram illustrating a plan view of an example of a semiconductor wafer according to embodiments of the present disclosure.

FIG. 3B is a schematic diagram illustrating a perspective view of an example of a semiconductor wafer according to some embodiments.

DETAILED DESCRIPTION OF THE EXAMPLES

Figure 1:
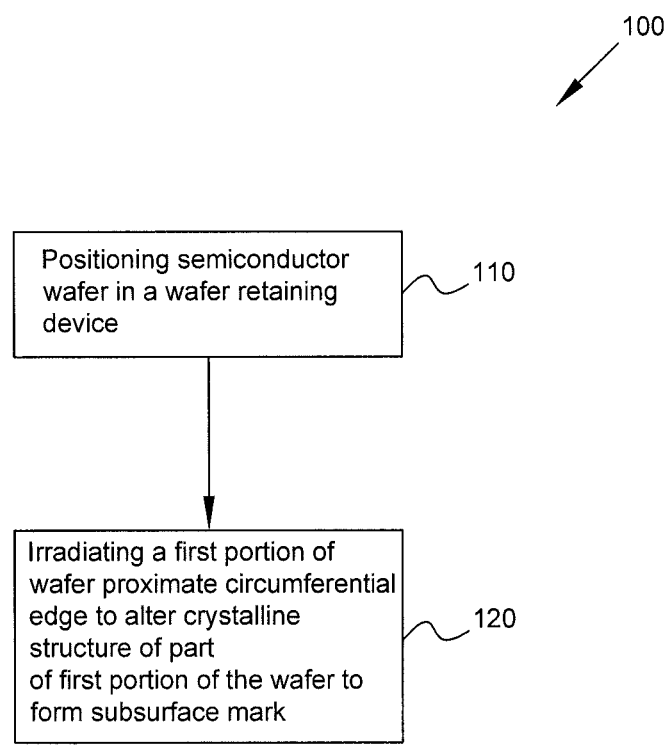
FIG. 1 is a flow chart illustrating a method according to embodiments of the present disclosure.

With reference to the Figures, where like elements have been given like numerical designations to facilitate an understanding of the drawings, the various embodiments of a multi-gate semiconductor device and methods of forming the same are described. The figures are not drawn to scale.

The following description is provided as an enabling teaching of a representative set of examples. Many changes can be made to the embodiments described herein while still obtaining beneficial results. Some of the desired benefits discussed below can be obtained by selecting some of the features or steps discussed herein without utilizing other features or steps. Accordingly, many modifications and adaptations, as well as subsets of the features and steps described herein are possible and can even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components.

As used herein, use of a singular article such as "a," "an" and "the" is not intended to exclude pluralities of the article's object unless the context clearly and unambiguously dictates otherwise.

Improved processes for fabricating semiconductor wafers and orienting semiconductor wafers are provided. The inventors have observed that by forming a subsurface mark in a semiconductor wafer, a detectable marker is provided that permits wafer orientation to be accomplished accurately and efficiently while minimizing the effect on semiconductor process performance. The inventors have observed that forming a subsurface mark in a semiconductor wafer permits orienting the wafer while avoiding non-uniformities across a wafer surface, for example, in photoresist coating thickness, chemical mechanical polish (CMP) film thickness, plasma density for etching processes, and chemical distribution for etching processes. The inventors have determined that the methods described herein improve yield and avoid costs associated with additional processes designed to obviate these non-uniformities across a wafer surface. The inventors have further determined that the methods described herein will avoid wafer contamination, equipment damage, and additional preventative maintenance requirements to avoid equipment damage, that are associated with providing a reference notch to orient the wafer.

FIG. 1 is a flow chart illustrating a method according to embodiments of the present disclosure. At block 110, a semiconductor wafer is positioned in a wafer retaining device. In various embodiments, the wafer retaining device is a chuck. In some embodiments, the wafer retaining device is an electrostatic chuck (ESC). For example, a semiconductor wafer can be supported by a pedestal (e.g. a platen) or other support platform (e.g. carousel spatula) that provides a support surface for a semiconductor wafer. In various embodiments, the wafer is retained to the pedestal using a chuck, such as, for example, an electrostatic chuck.

At block 120, a predetermined first portion of the wafer proximate a circumferential edge of the wafer is irradiated so as to alter a crystalline structure of at least part of the first portion of the wafer to form a subsurface mark in the crystalline structure, wherein the subsurface mark is detectable using light. In various embodiments, a light source irradiates the predetermined first portion of the wafer. In some embodiments, a laser is the light source that irradiates the predetermined first portion of the wafer. By way of example, a Nd-YAG laser can be used to irradiate the predetermined first portion of the wafer. The light source can be mounted on a rail and movable by a linear actuator, for example, towards or away from a central axis of the wafer to accommodate various wafer sizes. For example, the size of the semiconductor wafer can be, but is not limited to, a size of 1-inch (25 mm), 2-inch (51 mm), 3-inch (76 mm) 4-inch (100 mm) 5-inch (130 mm), 125 mm, 150 mm, 200 mm, 300 mm or 450 mm. In various embodiments, the predetermined first portion is disposed outside of the functional area of the wafer. As used herein, a functional area of the wafer is an area where integrated circuit (IC) dies are to be formed. In various embodiments, the predetermined first portion is disposed in an edge exclusion area of the wafer. For example, for a 150 mm wafer, an edge exclusion area can be a circumferential area disposed 2 mm radially inward from the edge of the wafer and about the circumference of the wafer where IC dies are absent or not used if present.

In various embodiments, a laser is directed at the first portion of the wafer. In some embodiments, the first portion can include a surface of the wafer. In some embodiments, a laser is directed and focused at the part of the first portion of the wafer to alter its crystalline structure. In various embodiments, a lens is used to focus the light from the light source at the part of the first portion of the wafer. Any suitable lens can be used to focus light from the light source. By way of example, a laser light source can be turned on and laser light can be focused by a lens and directed along an axis of irradiating at the part of the first portion of the wafer to form a subsurface mark. In various embodiments, the crystalline structure of the part of the first portion of the wafer is altered by melting the part of the first portion of the wafer. In some embodiments, a molten zone is formed in the first portion of the wafer. A molten zone can be a part of the first portion of the wafer where the crystalline structure is altered by a melting process. A subsurface mark can be formed at the molten zone of the wafer.

In various embodiments, the crystalline structure of at least a second part of the first portion of the wafer is maintained. In some embodiments, the at least part of the first portion of the wafer is less than the entire first portion, such that a focused, laser light alters the crystalline structure of a part, but not all, of the entire first portion. For example, the first portion of the wafer is located along an axis of irradiating and can include a surface of the wafer, and the crystalline structure of a part, but not all, of the first portion can be altered by the irradiating process.

In various embodiments, the subsurface mark is detectable using light. One or more subsurface mark searching units can provide the light to detect the subsurface mark. In some embodiments, a plurality of subsurface mark searching units are positioned or movably positionable for detecting the subsurface mark proximate a circumferential edge of the wafer. For example, two subsurface mark searching units can be positioned or movably positionable directly along a line segment that passes through an axis. Each subsurface mark searching unit can include a light source, a lens and a sensor. In some embodiments, the sensor can be a CMOS or a CCD imaging sensor to detect the subsurface mark.

In various embodiments, a subsurface mark is detected using light of a predetermined wavelength. In some embodiments, the subsurface mark is detectable using infrared radiation. For example, the subsurface mark can be detectable using infrared radiation having a wavelength of at least 1.1 micrometers. In some embodiments, the subsurface mark is detectable using infrared radiation having a wavelength between 1.1 micrometers and 1.5 micrometers. In various embodiments, the light source is an infrared light source that emits infrared light at a predetermined wavelength. In some embodiments, a sensor in a subsurface mark searching unit is an infrared sensor. In some embodiments, a subsurface mark is detectable using x-ray inspection. For example, the light source can be an x-ray source that emits x-rays at a predetermined wavelength. In some embodiments, a sensor in a subsurface mark searching unit is a x-ray sensor. The inventors have determined that by forming a subsurface mark proximate a circumferential edge of a wafer using irradiation, a reference is provided to orient the wafer while avoiding wafer contamination, equipment damage, and additional preventative maintenance to avoid equipment damage, that are associated with using a notch, for providing a reference to orient the wafer.

Figure 2:
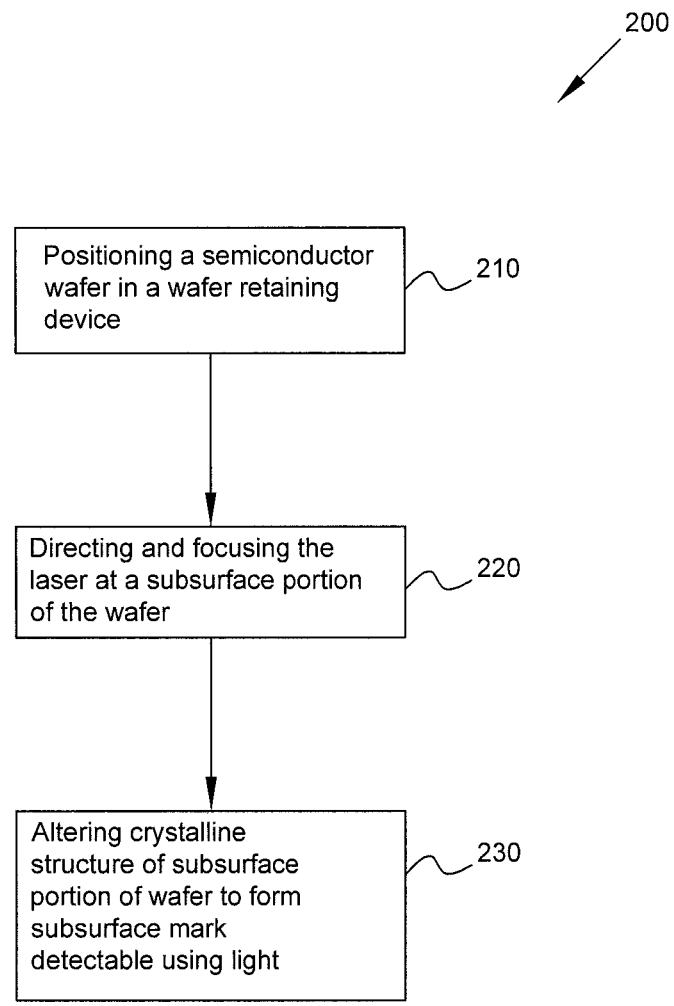
FIG. 2 is a flow chart illustrating a method according to some embodiments.

With reference now to FIG. 2, a flow chart illustrating a method according to some embodiments is provided. At block 210, a semiconductor wafer is positioned in a wafer retaining device as described above at block 110. At block 220, a laser is directed and focused at a subsurface portion of the wafer. In various embodiments, the laser can be directed and focused at a subsurface portion of the wafer using a lens. At block 230, a crystalline structure of the subsurface portion of the wafer is altered to form a subsurface mark. In various embodiments, the crystalline structure of the subsurface portion of the wafer is altered by melting the subsurface portion of the wafer. In some embodiments, a molten zone is formed at the subsurface portion of the wafer where the crystalline structure is altered by a melting process. A subsurface mark can be formed at the molten zone of the wafer.

Referring now to FIG. 3A, a schematic diagram illustrating a plan view of an example of a semiconductor wafer 300 according to embodiments of the present disclosure is provided. As shown, a subsurface mark 330 is formed in an area of the wafer 300 between a circumferential boundary 310 of the functional area of the wafer 300 and a circumferential edge 320 of the wafer 300. In the illustrated embodiment, the dashed lines represent various regions of the wafer 300 where dies can be formed subsequent to formation of a semiconductor mark 330. In various embodiments, the area between the circumferential boundary 310 and the circumferential edge 320 is an edge exclusion area of the wafer 300. Formation of dies is excluded from the edge exclusion area. With reference now to FIG. 3B, a schematic diagram illustrating a perspective view of an example of a semiconductor wafer 300 according to some embodiments is provided. Subsurface mark 330 is shown as having a substantially rectangular shape in the illustrated embodiment. However, the subsurface mark 330 can have any shape formed by altering the crystalline structure of a subsurface portion of the wafer 300 using irradiation as described herein.

Figure 4A:
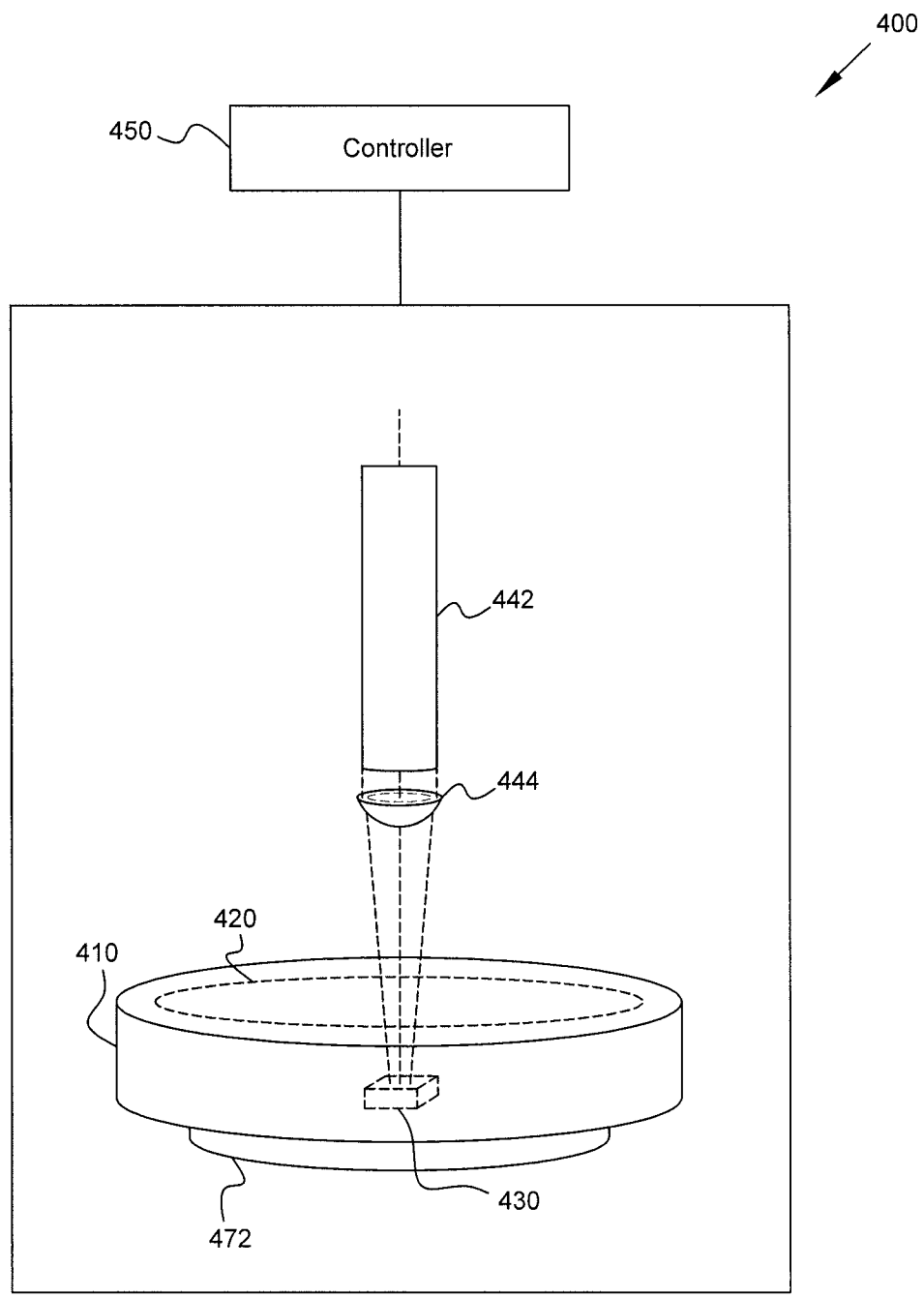
FIG. 4A is a schematic diagram illustrating a perspective view of an example of a subsurface mark forming apparatus according to embodiments of the present disclosure.
Figure 4B:
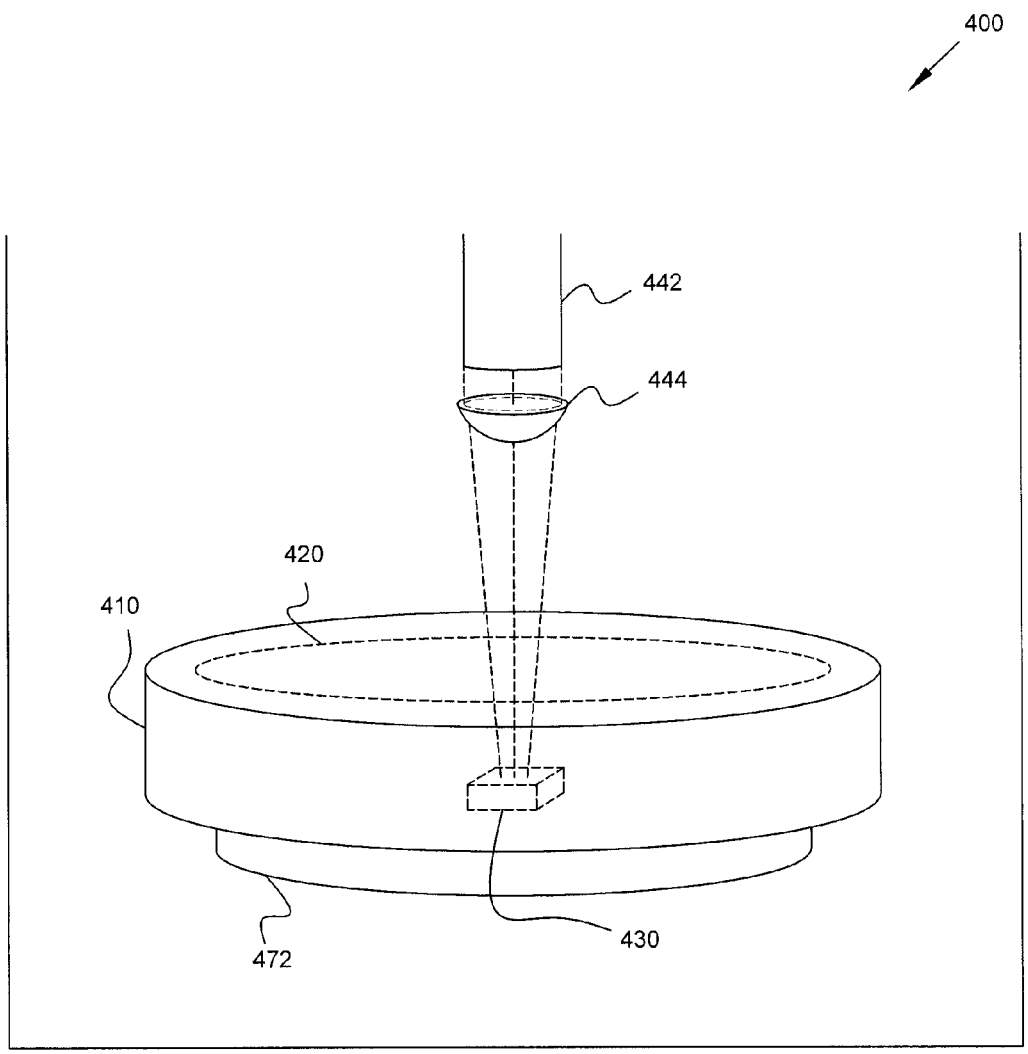
FIG. 4B is a schematic diagram illustrating a perspective view of an example of a subsurface mark forming apparatus according to embodiments of the present disclosure.

FIGS. 4A and 4B show an example of a semiconductor wafer subsurface mark forming apparatus 400 according to some embodiments. A light source 442 is provided. In some embodiments, light source 442 is a laser. In some embodiments, light source 442 is positioned along an axis of a retaining device (472) for retaining the semiconductor wafer. In other embodiments, light source 442 is one of a plurality of light sources positioned or movably positionable with a common radial distance from the axis of the retaining device (not shown) for retaining the semiconductor wafer. In various embodiments, light source 442 can include a light emitter, such as for example, a laser or a light emitting diode (LED). In some embodiments, light source 442 emits light at a predetermined wavelength. In other embodiments, a filter can be used to filter the wavelength of light emitted by the light source to that of a predetermined wavelength. The apparatus 400 can include a lens 444 for focusing the light from the light source 442. Any suitable lens can be used to focus light from the light source on a predetermined portion of the semiconductor wafer to form a subsurface mark 430. In some embodiments, the predetermined portion of the wafer is part of the edge exclusion area of the wafer. For example, light from a laser light source 442 can be focused by lens 444 and directed along an axis of irradiating at a portion of the wafer between circumferential boundary 420 and the circumferential edge 410 to form a subsurface mark 430. In various embodiments, controller 450 controls the apparatus to irradiate a portion of the wafer to form a subsurface mark. In some embodiments, the controller 450 is an embedded microprocessor. In various embodiments, the controller 450 is a digital signal processor implemented in application specific integrated circuitry (ASIC). In some embodiments, the controller 450 can be a networked computer or a programmable logic controller.

Figure 5:
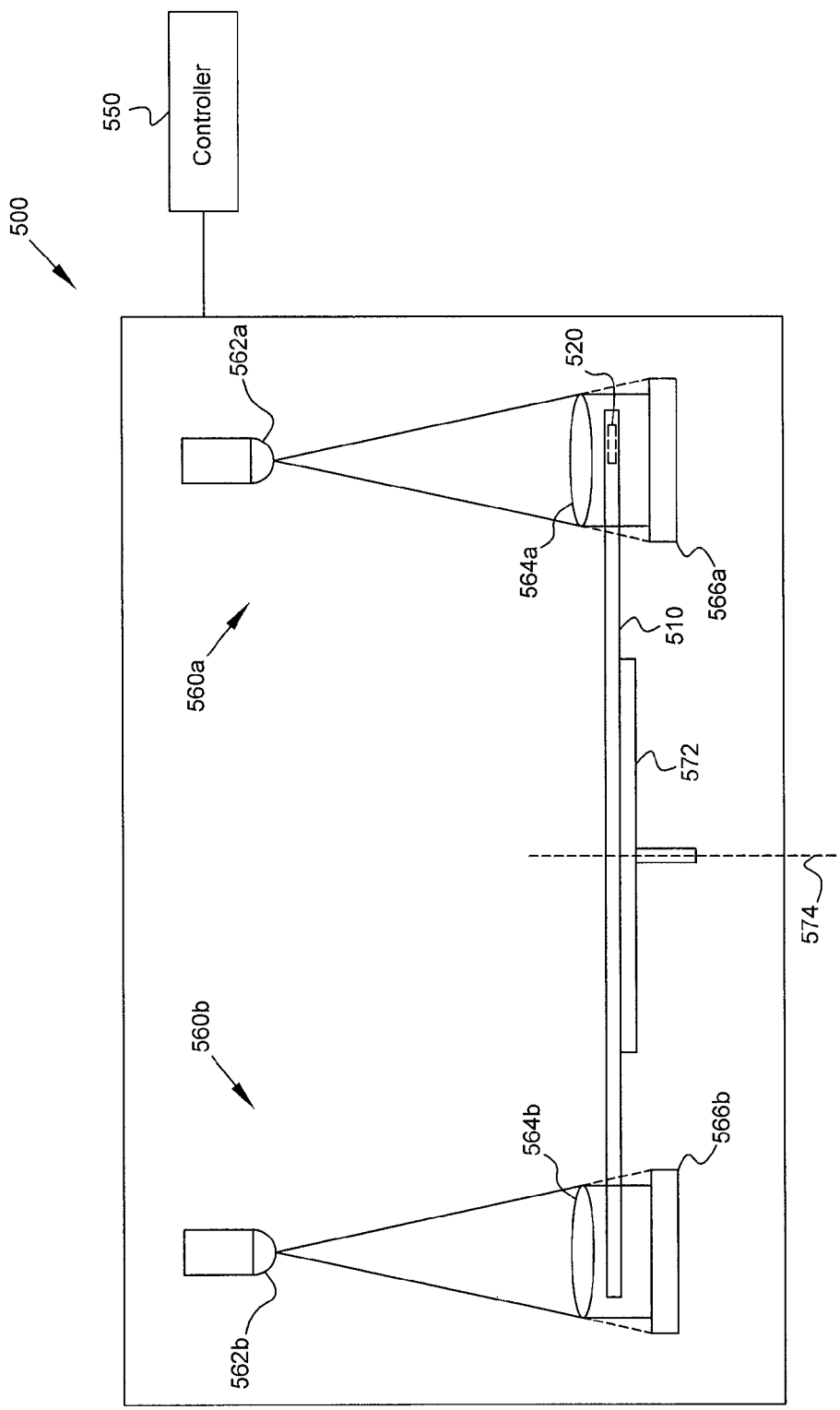
FIG. 5 is a schematic diagram illustrating a side view of a subsurface mark detecting apparatus according to embodiments of the present disclosure.

FIG. 5 provides a schematic diagram illustrating a side view of an example of a subsurface mark detecting apparatus 500. Subsurface mark detecting apparatus 500 includes at least one subsurface mark detecting unit (560a). In some embodiments, subsurface mark detecting apparatus 500 includes a plurality of subsurface mark detecting units (560a, 560b). FIG. 5 shows two subsurface mark detecting units 560a and 560b in schematic. Subsurface mark detecting apparatus 500 can include a chuck 572 for supporting and/or retaining a semiconductor wafer 510. In some embodiments, the chuck 572 is an electrostatic chuck. The chuck 572 can be rotatable about a central axis 574. In various embodiments, the subsurface mark detecting units 560a and 560b are positioned or movably positionable for detecting a subsurface mark 520 proximate a circumferential edge of the wafer 510. As shown in FIG. 5, the plurality of subsurface mark detecting units can include two subsurface mark detecting units 560a, 560b positioned or movably positionable opposite from each other along a line segment that passes through the axis 574.

Each subsurface mark detecting unit (560a, 560b) can include a light source 562a, 562b, a lens 564a, 564b, and a sensor 566a, 566b which can include, for example, a CCD or CMOS imaging sensor. In some embodiments, the subsurface mark detecting unit (560a, 560b) can include a light filter, for example, an infrared filter. In some embodiments, one or more of the subsurface mark detecting units 560a, 560b can be mounted on a rail and movable by, for example, a linear actuator towards or away from axis 574, to accommodate different sized wafers. Upon positioning the wafer 510 on the chuck 572, the subsurface mark detecting unit 560a, 560b can be actuated toward the axis 574, until sensor 566a, 566b detects a subsurface mark proximate a circumferential edge of the wafer 510. In various embodiments, subsurface mark detecting unit 560a, 560b detects subsurface mark 520 using light from light source 562a, 562b of a predetermined wavelength. For example, light having a wavelength in the visible spectrum (e.g. for a typical human eye between approximately 390 nanometers and 790 nanometers) cannot transmit through semiconductor wafer 510. However, the inventors have determined that light having a predetermined wavelength with a known transmittance through semiconductor wafer 510 can be used to detect a subsurface mark 520. In various embodiments, the subsurface mark 520 can have an altered crystalline structure while the crystalline structure outside of the subsurface mark 520 can be maintained. Subsurface mark detecting apparatus 560a, 560b can be used to detect changes in transmittance of light at a predetermined wavelength and proximate a circumferential edge of wafer 510 where a subsurface mark 520 can be formed.

In various embodiments, light source 562a, 562b is an infrared light source that emits infrared light at a predetermined wavelength. In various embodiments, the light emitted from light source 562a, 562b is infrared radiation. For example, the light emitted from light source 562a, 562b can have a wavelength of at least 1.1 micrometers to detect subsurface mark 520. In some embodiments, the light emitted from light source 562a, 562b can have a wavelength between approximately 1.1 micrometers and approximately 1.5 micrometers (e.g. 1.05 to 1.55 micrometers) to detect subsurface mark 520. For example, light having a wavelength of 1.1 micrometers can have a transmittance through the semiconductor wafer of approximately 70%. A formed subsurface mark 520 can be detected by monitoring for changes in light transmittance proximate a circumferential edge of wafer 510. In some embodiments, sensors 566a, 566b in subsurface mark searching units 560a, 560b are infrared sensors. In various embodiments, light source 560a, 560b can be an x-ray source that emits x-rays at a predetermined wavelength. For example, the light emitted from light source 560a, 560b can have a wavelength between 0.01 and 10 nanometers. In some embodiments, sensors 566a, 566b in subsurface mark searching units 560a, 560b are x-ray sensors or x-ray detectors. In various embodiments, controller 550 controls the apparatus to detect subsurface mark 520. In some embodiments, the controller 550 is an embedded microprocessor. In various embodiments, the controller 550 is a digital signal processor implemented in application specific integrated circuitry (ASIC). In some embodiments, the controller 550 can be a networked computer or a programmable logic controller.

Figure 6:
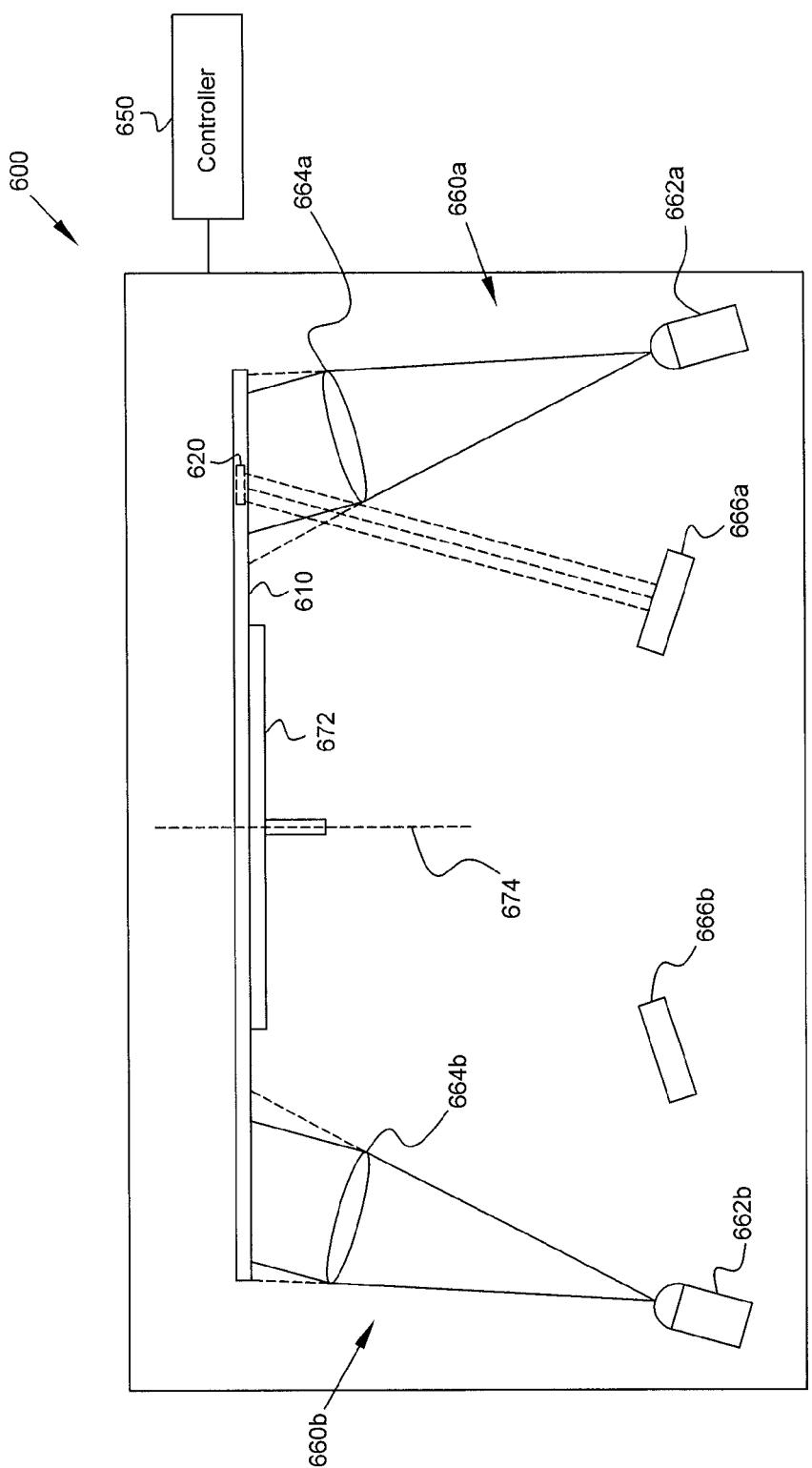
FIG. 6 is a schematic diagram illustrating a side view of a subsurface mark detecting apparatus according to some embodiments.

FIG. 6 is a schematic diagram illustrating a side view of an example of a subsurface mark detecting apparatus 600. Subsurface mark detecting apparatus 600 includes at least one subsurface mark detecting unit (660a). In the illustrated embodiment, two subsurface mark detecting units 660a and 660b are provided. As described above for subsurface mark detecting apparatus 500, subsurface mark detecting apparatus 600 can include a chuck 672 for supporting and/or retaining a semiconductor wafer 610 that can be rotatable about a central axis 674. In various embodiments, the subsurface mark detecting units 660a and 660b are positioned or movably positionable for detecting a subsurface mark 620 proximate a circumferential edge of the wafer 610. As shown in FIG. 6, the plurality of subsurface mark detecting units can include two subsurface mark detecting units 660a, 660b positioned or movably positionable on opposite sides of wafer 610 from each other to irradiate a portion of wafer 610 at a predetermined transmission angle relative to axis 674. In various embodiments, a thin film can be deposited on a surface, for example the upper surface, of wafer 610. In various embodiments, subsurface mark detecting units 660a, 660b can be positioned, or movably positionable, opposite the wafer 610 surface having a thin film deposited thereon.

In the illustrated embodiment, each subsurface mark detecting unit (660a, 660b) includes a light source 662a, 662b, a lens 664a, 664b, and a sensor 666a, 666b. Sensors 666a, 666b are positioned or movably positionable on opposite sides of wafer 610 from each other to receive reflected light at a predetermined reflectance angle relative to axis 674 at the intended reflectance point of the subsurface mark 620. The predetermined positioning of the light source 662a, 662b and the sensor are based on a light reflectance algorithm such that the angle of transmission of irradiated light ($\Theta_T$) relative to axis 674 equals the angle of reflectance ($\Theta_R$) relative to axis 674 and the reflected light received at the sensor 666a, 666b ($\Theta_T=\Theta_R$). In some embodiments, light source 662a, 662b can be a spot type or area type light source. In some embodiments, sensor 666a, 666b can be a spot type or area type light sensor. In some embodiments, subsurface mark detecting unit 660a, 660b can include a light filter (not shown), for example, an infrared filter. In various embodiments, subsurface mark detecting unit 660a, 660b detects subsurface mark 620 using light from light source 662a, 662b of a predetermined wavelength and at predetermined transmission ($\Theta_T$) and reflectance ($\Theta_R$) angles relative to axis 674. In various embodiments, the subsurface mark 620 can have an altered crystalline structure while the crystalline structure outside of the subsurface mark 620 can be maintained. Subsurface mark detecting apparatus 660a, 660b can be used to detect reflected light at a predetermined wavelength, at predetermined transmission ($\Theta_T$) and reflectance ($\Theta_R$) angles relative to axis 674 and relative to an intended reflectance point proximate a circumferential edge of wafer 610 where a subsurface mark 620 can be formed.

In various embodiments, light source 662a, 662b is an infrared light source that emits infrared light at a predetermined wavelength. In some embodiments, sensors 666a, 666b in subsurface mark searching unit 660a, 660b are infrared sensors. In various embodiments, light source 660a, 660b can be an x-ray source that emits x-rays at a predetermined wavelength. In some embodiments, sensors 666a, 666b in subsurface mark searching unit 660a, 660b are x-ray sensors or x-ray detectors. As described above for controller 550, controller 650 controls the apparatus to detect subsurface mark 620.

Figure 7:
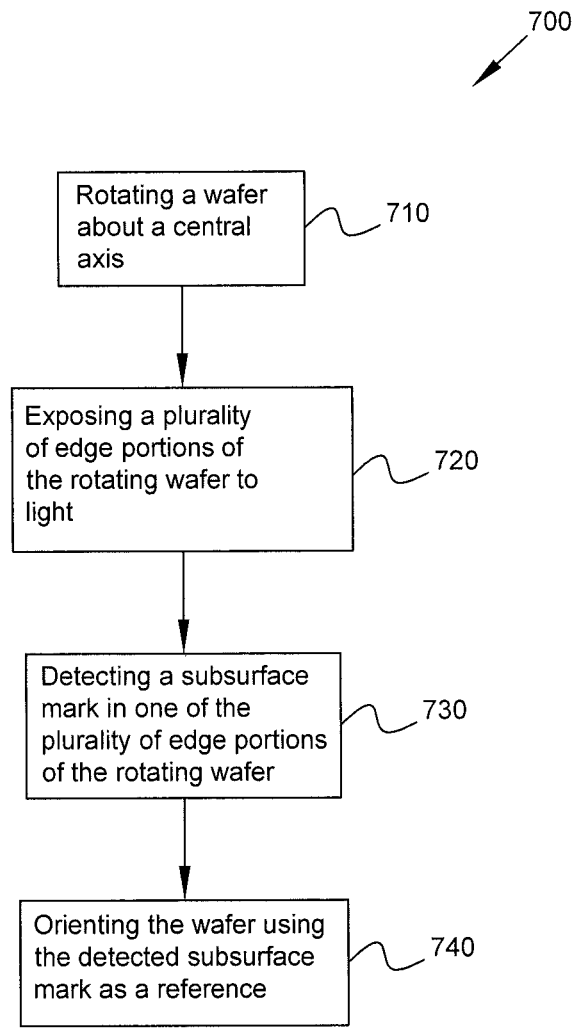
FIG. 7 is a flow chart illustrating a method of orienting a semiconductor wafer according to embodiments of the present disclosure.

FIG. 7 shows a flow chart illustrating a method of orienting a semiconductor wafer according to various embodiments. At block 710, a semiconductor wafer is rotated about a central axis. At block 720, a plurality of edge portions of the rotating wafer are exposed to light having a predetermined wavelength from one or more light sources.

In various embodiments, one or more irradiating light sources can be tuned on to begin exposing a plurality of edge portions of the rotating light from the respective light sources to detect a subsurface mark. For example, an edge portion of the rotating wafer can be a portion of an edge exclusion area of a rotating wafer. In various embodiments, the predetermined wavelength is an infrared wavelength. For example, the predetermined wavelength can be between approximately 1.1 micrometers and 1.5 micrometers (e.g. 1.05 and 1.55 micrometers). In some embodiments, the predetermined wavelength is a x-ray wavelength. At block 730, a subsurface mark is detected in one of the plurality of edge portions of the rotating wafer. In various embodiments, a subsurface mark can be detected by monitoring for changes in light transmittance at the plurality of edge portions of the rotating wafer. For example, in the embodiment shown in FIG. 5, the detected light level at each pixel of the detectors 566a, 566b can be determined, to precisely identify the location of the mark 520. At block 740 the semiconductor wafer is oriented using the detected subsurface mark as a reference. In some embodiments, the subsurface mark can be used as a reference point for alignment of the wafer for a semiconductor process. In some embodiments, the subsurface mark can be used as a reference for wafer handling machinery. In various embodiments, the subsurface mark can be used as a reference point for alignment of the wafer for analysis of a mark on the functional portion of the wafer.

As shown by the various configurations and embodiments illustrated in FIGS. 1-7, various improved systems and methods for fabricating and orienting semiconductor wafers have been described.

According to some embodiments, a system is provided. The system includes a wafer retaining device configured to retain a semiconductor wafer and a light source configured to emit light toward an edge exclusion area of the wafer. The system also includes a lens configured to direct and focus light emitted from the light source at a subsurface first part of a first portion of the wafer to alter a crystalline structure of the subsurface first part and form a subsurface mark that is detectable using light of a predetermined wavelength, a predetermined transmittance through the wafer, and at a predetermined reflectance angle relative to an axis of rotation of the wafer and based on the predetermined wavelength.

According to various embodiments, a system for orienting a semiconductor wafer is provided. The system includes a wafer retaining device that is configured to rotate a semiconductor wafer about a central axis and one or more susbsurface mark detecting units. Each of the one or more susbsurface mark detecting units include a light source configured to expose one or more edge portions outside of the functional area of the wafer to non-visible light having a predetermined wavelength, and a sensor configured to detect a subsurface mark in a subsurface part of one of the one or more edge portions of the wafer at a predetermined reflectance point relative to the central axis and based on the predetermined wavelength. The wafer retaining device is configured to orient the wafer using the detected subsurface mark as a reference.

According to some embodiments, a system is provided. The system includes a first wafer retaining device configured to retain a semiconductor wafer, a first light source configured to emit light toward a circumferential edge of the wafer, and a lens configured to direct and focus the emitted light at a subsurface first part of a first portion of the wafer to alter a crystalline structure of the subsurface first part and form a subsurface mark having a different crystalline structure from a second part of the first portion of the wafer wherein the second part of the first portion includes a surface of the wafer. The system further includes a second wafer retaining device configured to rotate the wafer about a central axis, and a susbsurface mark detecting unit. The susbsurface mark detecting unit includes a second light source configured to expose the circumferential edge of the wafer to non-visible light having a predetermined wavelength and a sensor configured to detect the subsurface mark at a predetermined reflectance angle relative to the central axis and based on the predetermined wavelength and at a predetermined reflectance point relative to the central axis and based on the predetermined wavelength.

While various embodiments have been described, it is to be understood that the embodiments described are illustrative only and that the scope of the subject matter is to be accorded a full range of equivalents, many variations and modifications naturally occurring to those of skill in the art from a perusal hereof.

Furthermore, the above examples are illustrative only and are not intended to limit the scope of the disclosure as defined by the appended claims. Various modifications and variations can be made in the systems of the present subject matter without departing from the spirit and scope of the disclosure. Thus, it is intended that the claims cover the variations and modifications that can be made by those of ordinary skill in the art.

What is claimed is:

1. A system, comprising:
   a wafer retaining device configured to retain a semiconductor wafer;
   a light source configured to emit light toward a first wafer portion within an edge exclusion area of the semiconductor wafer, wherein the first wafer portion comprises a first subsurface part embedded within the semiconductor wafer and a second part including an entire surface of the semiconductor wafer; and
   a lens configured to direct and focus light emitted from the light source at the first subsurface part to alter a crystalline structure of the first subsurface part, maintain a crystalline structure of the second part unchanged, and form a subsurface reference mark that is detectable to orient the semiconductor wafer relative the subsurface reference mark using light of a predetermined wavelength within the non-visible spectrum, a predetermined transmittance through the edge exclusion area of the semiconductor wafer, and at a predetermined reflectance angle relative to an axis of rotation of the semiconductor wafer and based on the predetermined wavelength.

2. The system of claim 1, wherein the light source is a laser.

3. The system of claim 1, wherein the second part of the first wafer portion includes a subsurface portion embedded within the semiconductor wafer and above the subsurface reference mark.

4. The system of claim 1, wherein the predetermined wavelength is an infrared or x-ray wavelength.

5. The system of claim 4, wherein the predetermined wavelength is between 1.1 micrometers and 1.5 micrometers.

6. The system of claim 1, wherein the wafer retaining device comprises an electrostatic chuck.

7. The system of claim 1, wherein the wafer retaining device is further configured to rotate the semiconductor wafer about the axis of rotation.

8. The system of claim 1, further comprising:
   one or more subsurface mark detecting units, each of the one or more subsurface mark detecting units comprising:
   a light source configured to emit light toward the edge exclusion area of the wafer; and
   a sensor configured to detect a subsurface mark embedded within the semiconductor wafer using the light of the predetermined wavelength, predetermined transmittance through the edge exclusion area of the semiconductor wafer, and at the predetermined reflectance angle.

9. A system for orienting a semiconductor wafer, comprising:
   a wafer retaining device that is configured to rotate a semiconductor wafer about a central axis;
   one or more subsurface mark detecting units, each of the one or more subsurface mark detecting units comprising:
   a light source configured to expose one or more portions within an edge exclusion area of the semiconductor wafer to light having a predetermined wavelength outside of a visible light wavelength band; and
   a sensor configured to detect that a subsurface mark surrounded by semiconductor material of the semiconductor wafer in a subsurface part of one of the one or more portions within the edge exclusion area of the wafer is at a predetermined reflectance point relative to the central axis based on the predetermined wavelength; and
   wherein the wafer retaining device is configured to orient the wafer using the detected subsurface mark as a reference.

10. The system of claim 9, wherein the wafer retaining device is configured to align the wafer for a semiconductor process using the detected subsurface mark as a reference.

11. The system of claim 10, wherein the wafer retaining device is configured to align the wafer for analysis of a mark on the functional portion of the wafer using the detected subsurface mark as a reference.

12. The system of claim 9, further comprising a lens configured to filter the light from the one or more light sources to the predetermined wavelength.

13. The system of claim 9, wherein the predetermined wavelength is an infrared or x-ray wavelength.

14. The system of claim 13, wherein the predetermined wavelength is between 1.1 micrometers and 1.5 micrometers.

15. The system of claim 9, wherein the sensor is configured to detect that the material in the subsurface mark has a different crystalline structure than other subsurface and surface portions of the wafer adjacent the subsurface mark.

16. The system of claim 9, wherein at least one of the other subsurface and surface portions of the semiconductor wafer adjacent the subsurface mark is a subsurface portion above the subsurface mark.

17. A system, comprising:
    a first wafer retaining device configured to retain a semiconductor wafer;
    a first light source configured to emit light toward a circumferential edge of the semiconductor wafer;
    a lens configured to direct and focus the emitted light at a first subsurface part of a first portion of the semiconductor wafer to alter a crystalline structure of the first subsurface part and form a subsurface reference mark having a different crystalline structure from a second subsurface part of the first portion of the semiconductor wafer and a third surface part of the first portion of the wafer;

a second wafer retaining device configured to rotate the wafer about a central axis;

a subsurface mark detecting unit comprising:
  a second light source configured to expose the circumferential edge of the semiconductor wafer to light having a predetermined wavelength outside of a visible wavelength band; and
  a sensor configured to detect the subsurface reference mark at a predetermined reflectance angle relative to the central axis and based on the predetermined wavelength and at a predetermined reflectance point relative to the central axis and based on the predetermined wavelength and further configured to provide the detected subsurface reference mark as a reference point for orienting the semiconductor wafer within the second wafer retaining device.

18. The system of claim 17, wherein the first and second wafer retaining devices are the same device.

19. The system of claim 17, wherein the first and second light sources are the same.

\* \* \* \* \*